United States Patent [19]

Wenk

[11] Patent Number: 5,254,169
[45] Date of Patent: Oct. 19, 1993

[54] HIGH-VACUUM COATING APPARATUS

[75] Inventor: Karl-Heinrich Wenk, Bad Nauheim, Fed. Rep. of Germany

[73] Assignee: Leybold Aktiengesellschaft, Hanau, Fed. Rep. of Germany

[21] Appl. No.: 914,752

[22] Filed: Jul. 15, 1992

[30] Foreign Application Priority Data

Mar. 10, 1992 [DE] Fed. Rep. of Germany ....... 4207525

[51] Int. Cl.$^5$ .................. C23C 14/24; C23C 14/26
[52] U.S. Cl. .................. 118/718; 118/719; 118/726; 118/733; 118/730
[58] Field of Search .......... 118/718, 719, 726, 730, 118/733; 49/477

[56] References Cited

U.S. PATENT DOCUMENTS

| | | | |
|---|---|---|---|
| 2,971,862 | 2/1961 | Baer et al. | 118/718 X |
| 3,854,442 | 12/1974 | Adam et al. | 118/718 |
| 4,380,211 | 4/1983 | Shinohara | 118/718 |
| 4,450,186 | 5/1984 | Shinohara | 118/78 X |
| 4,469,335 | 9/1984 | Moore | 49/477 X |
| 4,581,245 | 4/1986 | Nakamura et al. | |
| 4,622,919 | 1/1986 | Suzuki et al. | 118/719 X |
| 4,655,167 | 4/1987 | Nakamura et al. | 118/718 |
| 4,692,233 | 9/1987 | Casey | 118/718 X |
| 4,962,725 | 1/1990 | Heinz et al. | |
| 5,076,203 | 12/1991 | Vaidya et al. | 118/718 |

FOREIGN PATENT DOCUMENTS

| | | |
|---|---|---|
| 0311302 | 4/1989 | European Pat. Off. |
| 59-124038 | 7/1984 | Japan ................... 118/718 |
| 61-258333 | 11/1986 | Japan ................... 118/718 |
| 61-278030 | 12/1986 | Japan ................... 118/718 |
| 2207928 | 2/1989 | United Kingdom . |
| 2212518 | 7/1989 | United Kingdom . |

OTHER PUBLICATIONS

Wolf, Silicon Processing for the VLSI Era, 1986, pp. 78, 85-87, 89-92.
JP 010230775 A (Matsushita) Derwent English abstract, Sep. 1989.
JP 600017074 A (Konishiroku) Derwent English abstract, Jan. 1985.

Primary Examiner—Brian E. Hearn
Assistant Examiner—Jonathan D. Baskin
Attorney, Agent, or Firm—Felfe & Lynch

[57] ABSTRACT

A vacuum tank (1) in which a film is coated under high vacuum is divided by a partition wall (26) into a coating chamber (28) and a winding chamber (27) containing a supply roll (21) and a take-up roll (22). The coating chamber (28) contains an evaporator bank (24). Into the latter a coating cylinder (27) reaches. Diffusion pumps (14, 15) are connected exclusively to the coating chamber (28), so that the high vacuum necessary for the coating need be produced only in this coating chamber (28) and not in the entire vacuum tank (1). An inflatable gasket (32), variable in cross section, seals the partition wall (26) from the vacuum tank wall (1).

4 Claims, 2 Drawing Sheets

HIGH-VACUUM COATING APPARATUS

The invention relates to a high-vacuum coating apparatus for coating a film which is unwound from a supply roll in a vacuum tank which can be evacuated by mechanical pumps and at least one diffusion pump, and is carried over a coating cylinder to a winding roll, an evaporator bank being disposed underneath the coating cylinder for the evaporation of the coating material.

Coating apparatus of the above kind are used for coating films with a metal overlay and are generally known. They have a floor running unit running on tracks, which can be brought with a tank end plate sealingly against an open end face of the vacuum tank. On the side of the plate defining the vacuum tank are disposed a winder, an unwinder and, above an evaporator bank disposed stationarily in the vacuum tank, a coating cylinder for a film, a coating window, and additional components. To remove a coated roll of film from the apparatus and bring in a roll of the film that is to be coated, the floor running unit backs out of the vacuum tank with the components borne on its tank plate, so that the winder and unwinder become accessible.

Since a high vacuum must prevail in the vacuum tank during the coating process and the volume of the vacuum tank is large on account of the dimensions of the film to be coated and the process apparatus which the tank must contain, it takes a relatively long time after the winding unit has been rolled in and the tank end plate has been placed sealingly against the end of the vacuum tank, for the required high vacuum to be produced in it. Aside from the fact that this amount of time is lost for production, a relatively great amount of electrical energy is consumed during the pump-down by the mechanical pumps and the diffusion pumps.

The invention is addressed to the problem of improving a high-vacuum coating apparatus of the kind described above such that, after its vacuum tank is closed, the vacuum necessary for the coating process can be produced in a very quick and energy-saving manner.

This problem is solved in accordance with the invention by the fact that the vacuum tank is divided by a partition wall into a winding chamber containing the supply roll and the winding roll, and a coating chamber which contains the evaporator bank and into which reaches at least one portion of the coating cylinder which faces the evaporator bank and in which the coating of the film takes place, that the mechanical pumps for the evacuation of the winding chamber and the coating chamber are disposed and the diffusion pump is attached exclusively to the coating chamber.

As a result of this division of the vacuum tank, according to the invention, into a winding chamber and a coating chamber, the diffusion pump has only to evacuate the volume of the coating chamber—relatively small in comparison with the total volume of the vacuum tank—above the vacuum achievable by the mechanical vacuum pumps, and to produce a high vacuum only in that coating chamber. Therefore, after the vacuum tank is closed, the coating process can begin sooner than in the formerly known apparatus, so that the productivity of the apparatus according to the invention becomes greater and requires less electrical energy than former apparatus.

The coating chamber can be made especially small if, according to an advantageous further development of the invention, the vacuum tank has a rectangular cross section and the evaporator bank is disposed off-center, close to the front wall of the vacuum tank.

The partition wall will not interfere with the view of the evaporator bank from the front wall of the vacuum tank through an inspection glass, if the wall rises in the vacuum tank from the tank floor behind the evaporator bank and passes over the evaporator bank to the front wall of the tank.

The coating cylinder could be arranged entirely within the coating chamber. The volume of the coating chamber is especially small if, according to another improvement of the invention, the partition wall has an opening above the evaporator bank, through which the coating cylinder reaches. In such an embodiment it is not at all difficult to seal off the coating chamber sufficiently from the winding chamber.

Friction between the film and the partition wall of the coating chamber can be prevented if the coating cylinder with its film is sealed contactlessly against the edge of the opening by a gap seal.

In coating apparatus for films, the winder and unwinder are usually arranged beside one another and the coating cylinder underneath them between the winder and unwinder. The space in a vacuum tank divided by a partition wall into a winding chamber and coating chamber is especially well utilized, so that its total volume can be small, if the winder and unwinder are arranged one over the other and the coating cylinder is arranged beside them close to the front end of the vacuum tank.

The partition wall does not make it difficult to roll the floor running unit with its winder and unwinder out of the vacuum tank if the partition wall is part of the floor running unit and is fastened between its bearing plate and the tank end plate.

When the floor running unit is moving relative to the vacuum tank, a relative movement occurs between the partition wall and the wall of the vacuum tank. In order to prevent damage to the necessary seal between the partition wall and the wall of the vacuum tank, it is advantageous if, to seal the partition wall from the wall of the vacuum tank a tubular gasket is provided which is inflatable and thus variable in cross section. A tubular gasket of this kind can have a substantially small width in its uninflated and thus non-sealing state, so that there is plenty of clearance between the gasket and the wall, and therefore when the floor running unit is rolled out, even if the tolerances are rough, no contact can occur between these parts.

The gasket inflates of itself when the vacuum is produced and therefore automatically seals the coating chamber from the winding chamber if, according to another further development of the invention, the interior of the tubular gasket has communication with the atmosphere.

The space between the tubular gasket and the wall facing it is especially great in the uninflated state of the gasket, if the tubular gasket has an inwardly bulging portion which, when the pressure is equal in the interior of the tubular gasket and outside of it, will assume an inwardly withdrawn position through the elasticity of the tubular gasket.

The tubular gasket will have an especially advantageous form if it is in the shape of a rectangular U, and the inwardly bulging area is situated between the limbs of the U on the side facing the tank wall.

The partition wall does not have to be so stable that, in the event of the failure of vacuum pumps or valves, it will be able to withstand the maximum possible pressure difference between the winding chamber and the coating chamber, provided that a safety valve is disposed in the partition wall which will open to the lower-pressure side in the event of an unacceptable pressure difference between the winding chamber and the coating chamber.

The invention admits of numerous embodiments. For the further explanation of its basic principle, one such embodiment is represented in the drawing and described below.

BRIEF DESCRIPTION OF THE DRAWINGS

Referring now more particularly to FIG. 1, FIG. 1 shows a vacuum tank 1 of rectangular cross section in which the coating process takes place. On the right side of the vacuum tank 1 there is a floor running unit 2 which runs on rails 3. The floor running unit 2 has an end plate 4 which can be placed sealingly onto the right end of the vacuum tank by rolling the floor running unit 2 leftward. A winder 5 and an unwinder 6 reach from the end plate 4 toward the vacuum tank 1. Furthermore, in FIGS. 1 and 2 a coating cylinder 7 is shown at a level about halfway between the winder 5 and the unwinder 6, and in FIG. 2 underneath its seal there is shown a coating window 8. The winding motors 9 and 10 on the side of the end plate 4 facing away from the vacuum tank 1 serve for driving the winder 5 and unwinder 6. A bearing plate 11 on the side of the floor running unit supports the ends of winder 5 and unwinder 6 remote from the end plate 4. To prevent the tipping of the floor running unit 2 on account of the masses disposed in front of its end plate 4, the floor running unit 2 is supported at its forwardmost top point facing the vacuum tank 1 by wheels 12 running on a rail 13 which leads out of the vacuum tank 1 at the top.

Figure 1:
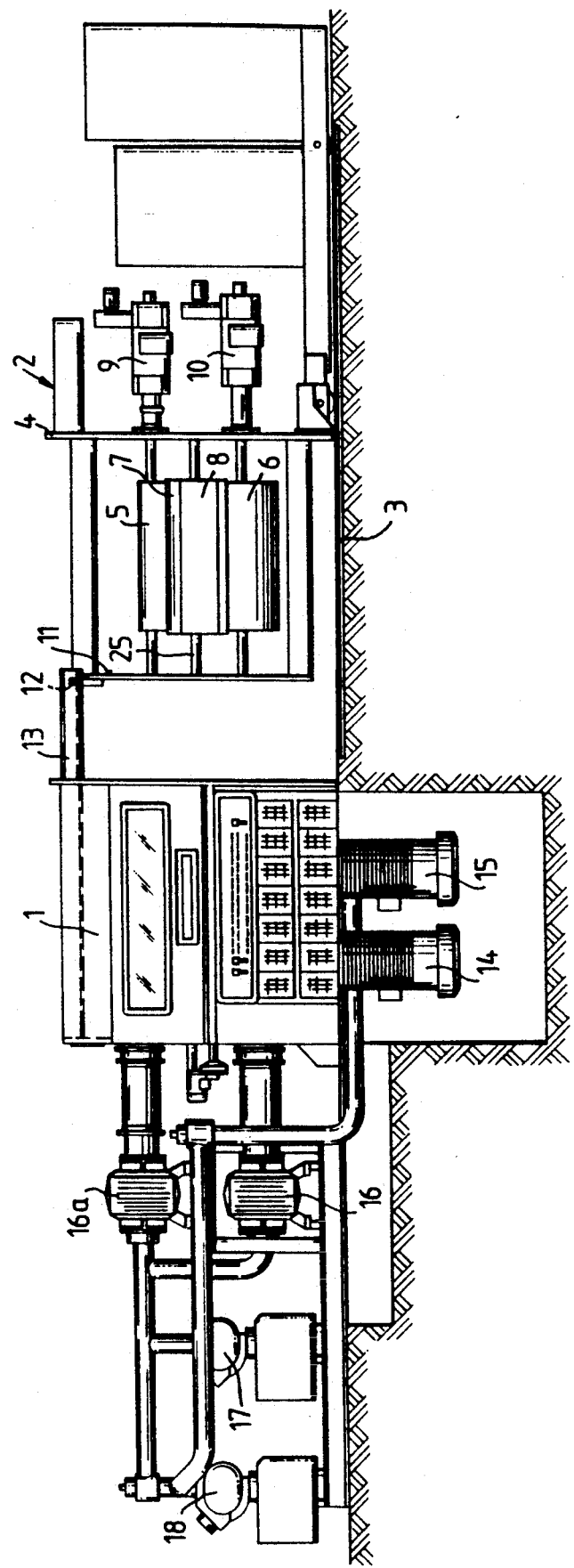
FIG. 1 is a side view of a high-vacuum coating apparatus according to the invention.

Two diffusion pumps 14 and 15 are disposed below the vacuum tank 1 for the evacuation of the vacuum tank 1. Also, a set of mechanical pumps 16, 16a, 17 and 18 is situated in back of the vacuum tank 1. At the start of a coating process a roll of the film that is to be coated is loaded onto the unwinder 6 and the film is then guided over pulley rolls and the coating cylinder 7 to the take-up winder 5. Then the floor running unit 2 is rolled into the vacuum tank 1 until its end plate 4 closes the vacuum tank 1. Then the vacuum tank 1 is evacuated by the mechanical pumps 16-18 and a portion of it by the diffusion pumps 14, 15.

Figure 2:
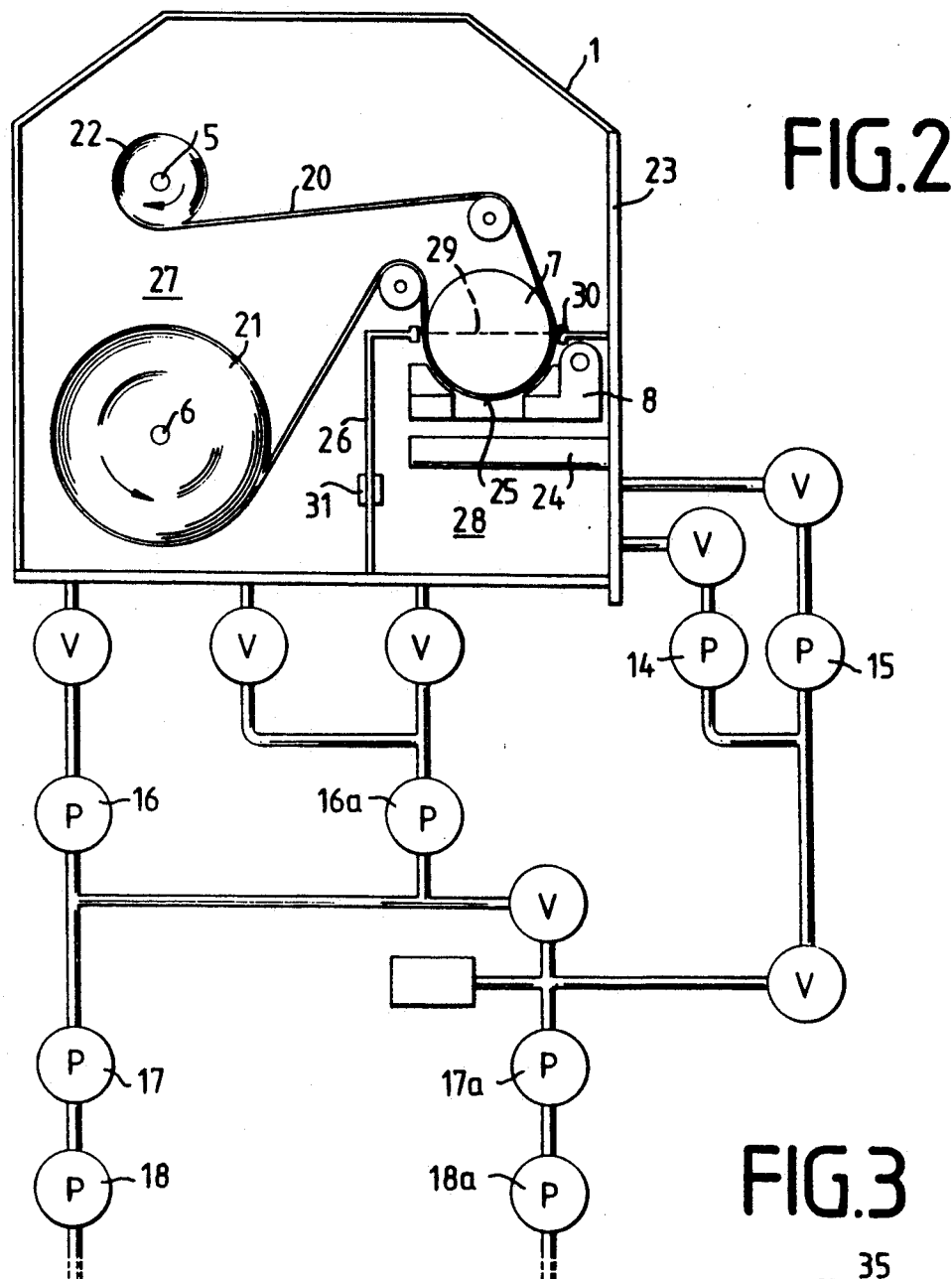
FIG. 2 is a diagrammatic cross sectional view through a vacuum tank of the coating apparatus.

Referring now to FIG. 2, FIG. 2 shows diagrammatically the unwinder 6 in the vacuum tank 2 and above it the winder 5. Also it can be seen that the coating cylinder 7 is situated in front of the winder 5 and the unwinder 6 at a level about halfway between them. The film 20 to be coated runs from a supply roll 21 disposed on the unwinder 6, over the coating cylinder 7, to a take-up roll 22 on the winder 5.

An evaporator bank 24 is fixedly disposed in the vacuum tank 1 adjacent to its front wall 23. From it the coating material evaporates through the coating window 8 against a coating area 25 of the film 20 on the coating cylinder 7.

Important for the invention is a partition wall 26 held by the floor running unit 2. When the ground running unit 2 has been rolled into the vacuum tank 1, it divides the vacuum tank 1 into a relatively large winding chamber 27 and a substantially smaller coating chamber 28. The evaporator bank 24 and the coating window 8 which travels with the floor running unit 2 are disposed in this coating chamber 28. Also, a bottom portion of the coating cylinder 7, which forms the coating area 25, extends downwardly through an opening 29 in the partition wall 26 into the coating chamber 28, a gap seal 30 and the coating window 8 providing for sufficient sealing off from the winding chamber 7.

The diffusion pumps 14 and 15 indicated diagrammatically in FIG. 2 are connected exclusively to the coating chamber 28, while the mechanical pumps 16, 17, 18 and 16a, 17a and 18a serve for the evacuation of the winding chamber 27 and the coating chamber 28. In order to prevent the partition wall 26 from exposure to a high pressure difference in the event of a failure of pumps 14-18 or other disturbance, a safety valve 31 is disposed in it, which can open to the side of lower pressure in the event of an excessively high pressure difference.

Figure 3:
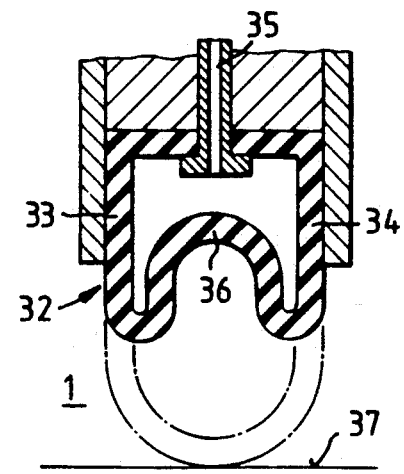
FIG. 3 is a cross sectional view through a gasketed portion within the vacuum tank.

A tubular gasket 32 represented in cross section in FIG. 3 serves for the sealing of the partition wall 26 to the front wall 23 and the other walls of the vacuum tank 1. It has an inwardly bulging area 36 between two parallel lateral portions 33 and 34. When the pressure inside of the tubular seal 32 and outside of it is equal, the inwardly bulging area 36 assumes the inwardly bulged position represented, so that the tubular seal 32 is a good distance away from a vacuum tank wall surface 37 against which it is intended to seal when there is a vacuum in the vacuum tank 1.

The tubular seal 32 has a connection to the atmosphere at 35, so that atmospheric pressure always prevails in it. When a vacuum is produced in the vacuum tank, the atmospheric pressure forces the inwardly bulging area 36 outwardly against the vacuum tank wall surface 37, as it has been represented in broken lines. In this manner sealing action is produced only when there is a vacuum in the vacuum tank 1.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. High-vacuum coating apparatus for coating a film comprising: an evacuable vacuum tank, mechanical pumps and at least one diffusion pump for evacuating the vacuum tank, a supply roll for unwinding a film, a take-up roll, a coating cylinder for guiding the film to the take-up roll, an evaporator bank disposed underneath the coating cylinder for the evaporation of the coating material, a partition wall for dividing the vacuum tank into a winding chamber having the supply roll and take-up roll and a coating chamber which contains the evaporator bank and into which at least one area of the coating cylinder, where the coating of the film takes place, extends facing the evaporator bank, the mechanical pumps being disposed for the evacuation of the winding chamber and the coating chamber, and the diffusion pump being connected exclusively to the coating chamber, the apparatus including a floor running unit having the partition wall including a bearing plate and a tank-end plate between which plates the partition wall is fastened, the vacuum tank having a wall and the apparatus including an inflatable tubular gasket, which therefore is variable in cross section, for sealing the partition wall from the wall of the vacuum tank, the tubular gasket having an interior having an atmosphere connection.

2. High-vacuum coating apparatus according to claim 1, in which the tubular gasket has an inwardly bulging area, which when the pressure in the interior of the tubular gasket and its exterior is equal assumes a position bulging inwardly into the tubular gasket.

3. High-vacuum coating apparatus according to claim 1, in which the tubular gasket has the shape of a rectangular U profile and the inwardly bulging portion is situated between limbs of the U on a side facing the tank wall.

4. High-vacuum coating apparatus according to claim 1, which includes in the partition wall a safety valve which, in the event of an unacceptable pressure difference between the winding chamber and the coating chamber will open to the side that has the lower pressure.

* * * * *